(12) United States Patent
Mittal et al.

(10) Patent No.: US 12,424,205 B2
(45) Date of Patent: Sep. 23, 2025

(54) COMPUTER TECHNOLOGY FOR CONTROLLING DIGITAL TWIN SIMULATION IN VOICE ASSISTANT DEVICES

(71) Applicant: INTERNATIONAL BUSINESS MACHINES CORPORATION, Armonk, NY (US)

(72) Inventors: Shilpa Bhagwatprasad Mittal, Pune (IN); Akash U. Dhoot, Pune (IN); Sarbajit K. Rakshit, Kolkata (IN); Shailendra Moyal, Pune (IN)

(73) Assignee: International Business Machines Corporation, Armonk, NY (US)

( * ) Notice: Subject to any disclaimer, the term of this patent is extended or adjusted under 35 U.S.C. 154(b) by 483 days.

(21) Appl. No.: 17/809,286

(22) Filed: Jun. 28, 2022

(65) Prior Publication Data

US 2023/0419954 A1 Dec. 28, 2023

(51) Int. Cl.
*G10L 15/08* (2006.01)
*G06F 18/214* (2023.01)
(Continued)

(52) U.S. Cl.
CPC .......... *G10L 15/083* (2013.01); *G06F 18/214* (2023.01); *G06F 30/20* (2020.01);
(Continued)

(58) Field of Classification Search
CPC . G10L 15/083; G10L 15/22; G10L 2015/223; G06F 18/214; G06F 30/20; G06N 5/022
See application file for complete search history.

(56) References Cited

U.S. PATENT DOCUMENTS 9,997,158 B2 * 6/2018 Chen ..................... H04L 67/104
10,628,749 B2 * 4/2020 Block ..................... G06N 5/048
(Continued)

OTHER PUBLICATIONS

D. A. Ferrucci, "Introduction to "This is Watson"," in IBM Journal of Research and Development, vol. 56, No. 3.4, p. 1:1-1:15, May-Jun. 2012, doi: 10.1147/JRD.2012.2184356. (Year: 2012).*
(Continued)

*Primary Examiner* — Fariba Sirjani
(74) *Attorney, Agent, or Firm* — Stephen R. Yoder

(57) ABSTRACT

Computer technology that receives a query and a desired level of precision and/or accuracy (herein, a "p/a value") associated with the received query, determines whether the p/a value exceeds a predetermined threshold, if the p/a value exceeds the predetermined threshold, then the virtual assistant system applies digital twin simulation to a digital twin data set in determining the query response to improve precision and/or accuracy of the query response, and outputs the query response to the querying party (for example, output as sound data in a voice assistant system). If the p/a value is below the threshold value, then the digital twin simulation is not performed, which makes the response quicker and puts less computational power demands on the virtual assistant system. In some embodiments, the virtual assistant system calculates the p/a value based on context.

13 Claims, 4 Drawing Sheets

(51) Int. Cl.
*G06F 30/20* (2020.01)
*G06N 5/022* (2023.01)
*G10L 15/22* (2006.01)

(52) U.S. Cl.
CPC .............. *G06N 5/022* (2013.01); *G10L 15/22* (2013.01); *G10L 2015/223* (2013.01)

(56) References Cited

U.S. PATENT DOCUMENTS

| | | | | |
|---|---|---|---|---|
| 2011/0125734 | A1* | 5/2011 | Duboue | G09B 7/00 707/723 |
| 2014/0280087 | A1* | 9/2014 | Isensee | G06F 16/24578 707/723 |
| 2017/0356752 | A1* | 12/2017 | Lobo | G01C 21/3415 |
| 2019/0171728 | A1* | 6/2019 | Wakankar | G06F 16/90324 |
| 2020/0159795 | A1* | 5/2020 | Weldemariam | G06F 16/9535 |
| 2021/0027766 | A1* | 1/2021 | Shi | G10L 15/063 |
| 2021/0109837 | A1* | 4/2021 | Rakshit | G06F 11/3476 |
| 2021/0150386 | A1* | 5/2021 | DeLuca | G06F 16/24578 |
| 2022/0101096 | A1* | 3/2022 | Singer | G06N 5/022 |
| 2023/0055641 | A1* | 2/2023 | Prasath | G06F 9/451 |
| 2023/0418909 | A1* | 12/2023 | Barkan | G06F 18/217 |
| 2023/0419954 | A1* | 12/2023 | Mittal | G10L 15/22 |
| 2025/0150351 | A1* | 5/2025 | Karampatsis | H04L 41/14 |

OTHER PUBLICATIONS

Disclosed Anonymously, "AI Assistance Interaction with Visual Simulation on Edge Device", An IP.com Prior Art Database Technical Disclosure, IP.com No. IPCOM000262813D, Jul. 1, 2020, 6 pgs.

Disclosed Anonymously, "System for Visualizing and Influencing the Determining Factors for Answers from a Cognitive Question and Answer System", An IP.com Prior Art Database Technical Disclosure, IP.com No. IPCOM000247267D, Aug. 18, 2016, 7 pgs.

Unknown, "Meet XMOS 'Digital Twin', A Futuristic Voice Assistant Which Adapts to Your Way of Interaction", Retrieved from: https://analyticsindiamag.com/it-services/meet-xmos-digital-twin-a-futuristic-voice-assistant-which-adapts-to-your-way-of-interaction/, Jan. 22, 2019, 18 pages.

* cited by examiner

COMPUTER TECHNOLOGY FOR CONTROLLING DIGITAL TWIN SIMULATION IN VOICE ASSISTANT DEVICES

BACKGROUND

The present invention relates generally to the field of virtual assistant systems (sometimes also herein referred to as "virtual assistance systems") and also to the field of digital twin simulations working in conjunction with virtual assistance systems. Virtual assistance systems that interact with a user primarily by voice are sometimes herein more specifically referred to as "voice assistant systems."

The Wikipedia entry for "Digital Twin" (as of Mar. 30, 2022) states, in part, as follows: "A digital twin is a virtual representation that serves as the real-time digital counterpart of a physical object or process . . . Digital twins are the result of continual improvement in the creation of product design and engineering activities. Product drawings and engineering specifications progressed from handmade drafting to computer aided drafting/computer aided design to model-based systems engineering. The digital twin of a physical object is dependent on the digital thread—the lowest level design and specification for a digital twin—and the 'twin' is dependent on the digital thread to maintain accuracy. Changes to product design are implemented using engineering change orders (ECO). An ECO made to a component item will result in a new version of the item's digital thread, and correspondingly to the digital twin . . . The digital twin concept consists of three distinct parts: the physical product, the digital/virtual product, and connections between the two products. The connections between the physical product and the digital/virtual product is data that flows from the physical product to the digital/virtual product and information that is available from the digital/virtual product to the physical environment."

The Wikipedia entry for "Virtual Assistant" (as of Mar. 30, 2022) states, in part, as follows: "An intelligent virtual assistant (IVA) or intelligent personal assistant (IPA) is a software agent that can perform tasks or services for an individual based on commands or questions. The term 'chatbot' is sometimes used to refer to virtual assistants generally or specifically accessed by online chat. In some cases, online chat programs are exclusively for entertainment purposes. Some virtual assistants are able to interpret human speech and respond via synthesized voices. Users can ask their assistants questions, control home automation devices and media playback via voice, and manage other basic tasks such as email, to-do lists, and calendars with verbal commands. A similar concept, however with differences, lays under the dialogue systems." (footnote(s) omitted)

A "digital twin" is defined, for purposes of this document, as a set of computer data that: (i) includes attribute data values that are set to match real world physical attributes in a real world product corresponding to the digital twin; and (ii) the attribute values of the digital twin are updated, on an ongoing basis to match the attributes of the corresponding real-world product as those change and evolve over time and with use of the product.

A digital twin simulation refers to any simulation that utilizes a set of digital twin(s). More specifically, the digital twin simulation sets up projected possible future conditions and observes how the digital twin responds to those possible future conditions. For example, if a digital twin of an automobile is heated, in a simulation, to a temperature of several thousand degrees, then the attribute values corresponding to the automobile's virtual chassis would lose their structural integrity as the digital twin automobile virtually melted in the simulation. Digital twin simulations can be confirmed if the actual product is exposed to similar conditions in the real world. To pick up the example of the virtually heated digital twin, heating the actual, real world automobile in a large furnace to a temperature of several thousand degrees would cause the actual chassis to melt and lose its structural integrity. Of course, the digital twin simulation, because of its future-looking component, can help avoid bad outcomes and sub-optimal real world behavior—under the present pedagogical example, that would mean keeping the actual real world automobile out of hot furnaces.

SUMMARY

According to an aspect of the present invention, there is a method, computer program product and/or system for use with a digital twin data set that represents a real life product that performs the following operations (not necessarily in the following order): (i) receiving, from a first user and over a communication network a first query that relates to the real life product; (ii) performing a digital twin simulation on the digital twin data set to obtain a response to the first query; and (iii) communicating, over the communication network and to the first user, the response to the first query.

DETAILED DESCRIPTION

Figure 1:
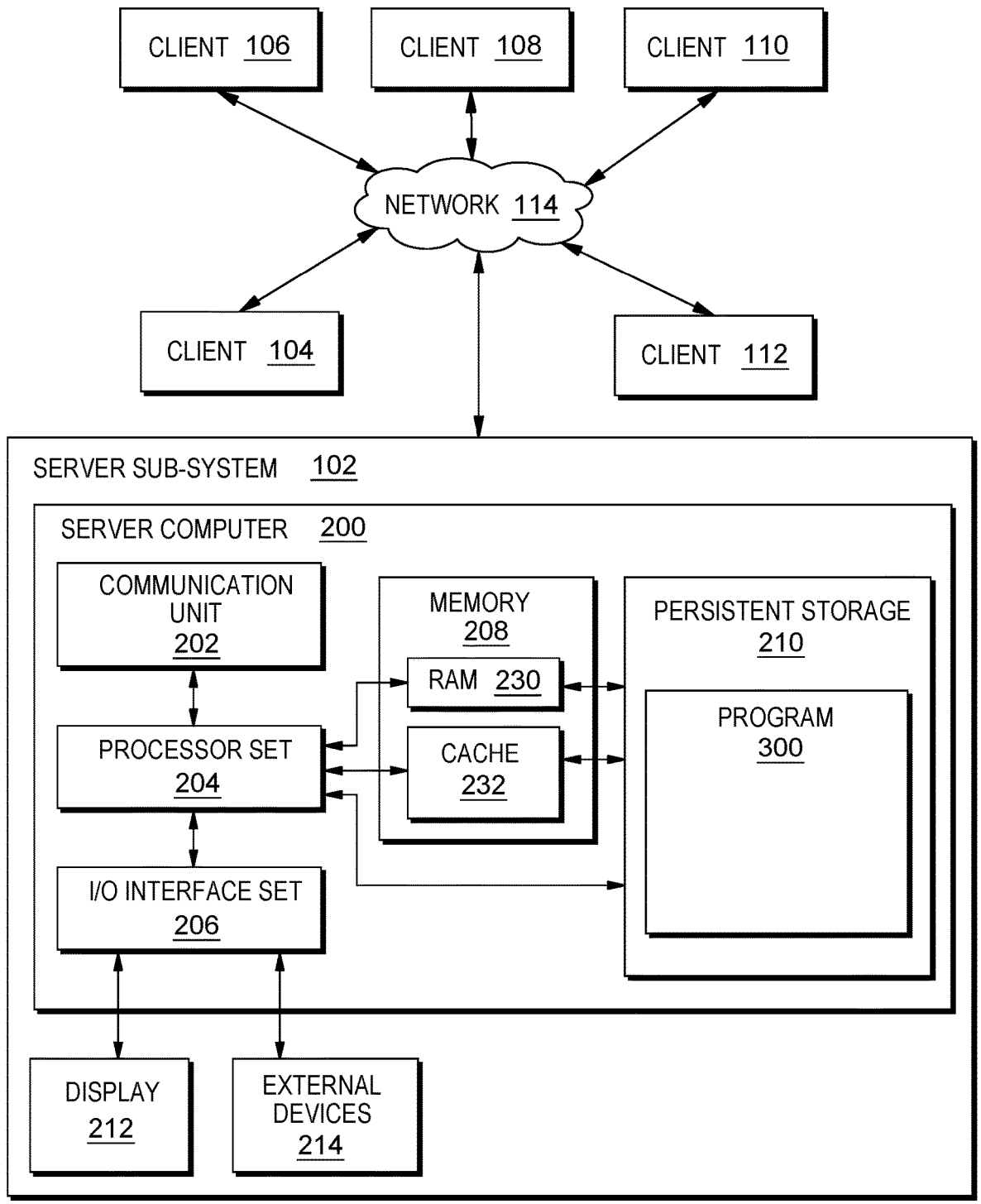
FIG. 1 is a block diagram view of a first embodiment of a system according to the present invention.

Some embodiments of the present invention are directed to a virtual assistant system that: (i) receives a query; (ii) receives the desired level of precision and/or accuracy (herein, a "p/a value") associated with the received query: (iii) determines whether the p/a value exceeds a predetermined threshold; (iv) if the p/a value exceeds the predetermined threshold, then the virtual assistant system applies digital twin simulation to a digital twin data set in determining the query response to improve precision and/or accuracy of the query response; and (v) outputs the query response to the querying party (for example, output as sound data in a voice assistant system). If the p/a value is below the threshold value, then the digital twin simulation is not performed, which makes the response quicker and puts less computational power demands on the virtual assistant system. In some embodiments, the virtual assistant system calculates the p/a value based on context. This Detailed Description section is divided into the following subsections: (i) The Hardware and Software Environment; (ii) Example Embodiment; (iii) Further Comments and/or Embodiments; and (iv) Definitions.

I. The Hardware and Software Environment

The present invention may be a system, a method, and/or a computer program product at any possible technical detail level of integration. The computer program product may include a computer readable storage medium (or media) having computer readable program instructions thereon for causing a processor to carry out aspects of the present invention. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (for example, light pulses passing through a fiber-optic cable), or electrical signals transmitted through a wire.

A "storage device" is hereby defined to be anything made or adapted to store computer code in a manner so that the computer code can be accessed by a computer processor. A storage device typically includes a storage medium, which is the material in, or on, which the data of the computer code is stored. A single "storage device" may have: (i) multiple discrete portions that are spaced apart, or distributed (for example, a set of six solid state storage devices respectively located in six laptop computers that collectively store a single computer program); and/or (ii) may use multiple storage media (for example, a set of computer code that is partially stored in as magnetic domains in a computer's non-volatile storage and partially stored in a set of semiconductor switches in the computer's volatile memory). The term "storage medium" should be construed to cover situations where multiple different types of storage media are used.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As shown in FIG. 1, networked computers system 100 is an embodiment of a hardware and software environment for use with various embodiments of the present invention. Networked computers system 100 includes: server subsystem 102 (sometimes herein referred to, more simply, as subsystem 102); client subsystems 104, 106, 108, 110, 112; and communication network 114. Server subsystem 102 includes: server computer 200; communication unit 202; processor set 204; input/output (I/O) interface set 206; memory 208; persistent storage 210; display 212; external device(s) 214; random access memory (RAM) 230; cache 232; and program 300.

Subsystem 102 may be a laptop computer, tablet computer, netbook computer, personal computer (PC), a desktop computer, a personal digital assistant (PDA), a smart phone, or any other type of computer (see definition of "computer" in Definitions section, below). Program 300 is a collection of machine readable instructions and/or data that is used to create, manage and control certain software functions that will be discussed in detail, below, in the Example Embodiment subsection of this Detailed Description section.

Subsystem 102 is capable of communicating with other computer subsystems via communication network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client subsystems.

Subsystem 102 is shown as a block diagram with many double arrows. These double arrows (no separate reference numerals) represent a communications fabric, which provides communications between various components of subsystem 102. This communications fabric can be implemented with any architecture designed for passing data and/or control information between processors (such as microprocessors, communications and network processors, etc.), system memory, peripheral devices, and any other hardware components within a computer system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for subsystem 102; and/or (ii) devices external to subsystem 102 may be able to provide memory for subsystem 102. Both memory 208 and persistent storage 210: (i) store data in a manner that is less transient than a signal in transit; and (ii) store data on a tangible medium (such as magnetic or optical domains). In this embodiment, memory 208 is volatile storage, while persistent storage 210 provides nonvolatile storage. The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202 provides for communications with other data processing systems or devices external to subsystem 102. In these examples, communications unit 202 includes one or more network interface cards. Communications unit 202 may provide communications through the use of either or both physical and wireless communications links. Any software modules discussed herein may be downloaded to a persistent storage device (such as persistent storage 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, program 300, can be stored on such portable computer-readable storage media. I/O interface set 206 also connects in data communication with display 212. Display 212 is a display device that provides a mechanism to display data to a user and may be, for example, a computer monitor or a smart phone display screen.

In this embodiment, program 300 is stored in persistent storage 210 for access and/or execution by one or more computer processors of processor set 204, usually through one or more memories of memory 208. It will be understood by those of skill in the art that program 300 may be stored in a more highly distributed manner during its run time and/or when it is not running. Program 300 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer-readable storage media that is capable of storing program instructions or digital information.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

II. Example Embodiment

Figure 2:
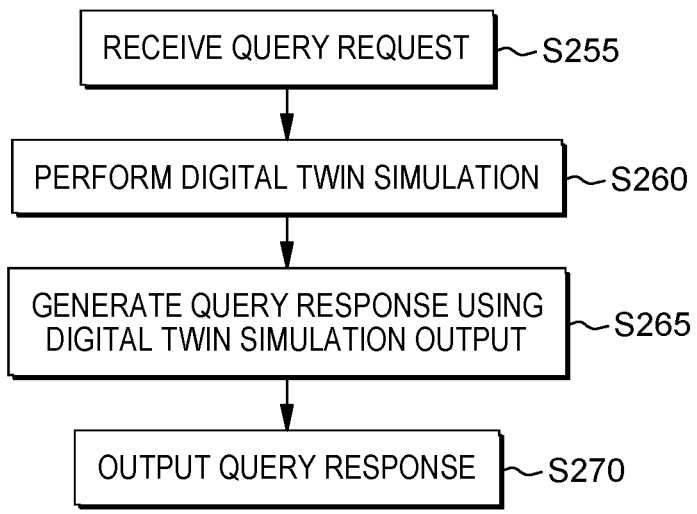
FIG. 2 is a flowchart showing a first embodiment method performed, at least in part, by the first embodiment system.
Figure 3:
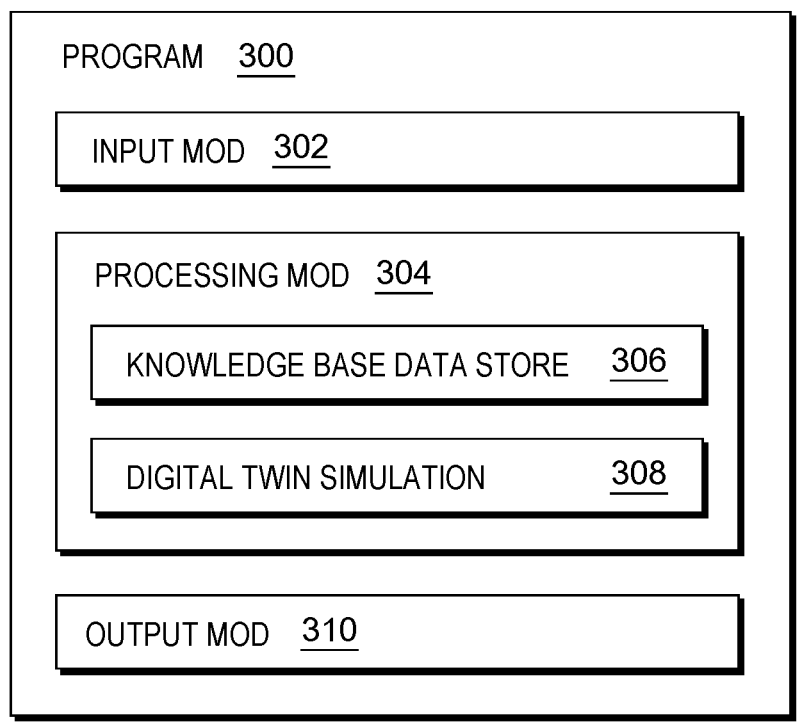
FIG. 3 is a block diagram showing a machine logic (for example, software) portion of the first embodiment system.

As shown in FIG. 1, networked computers system 100 is an environment in which an example method according to the present invention can be performed. As shown in FIG. 2, flowchart 250 shows an example method according to the present invention. As shown in FIG. 3, program 300 performs or controls performance of at least some of the method operations of flowchart 250. This method and associated software will now be discussed, over the course of the following paragraphs, with extensive reference to the blocks of FIGS. 1, 2 and 3.

Figure 4:
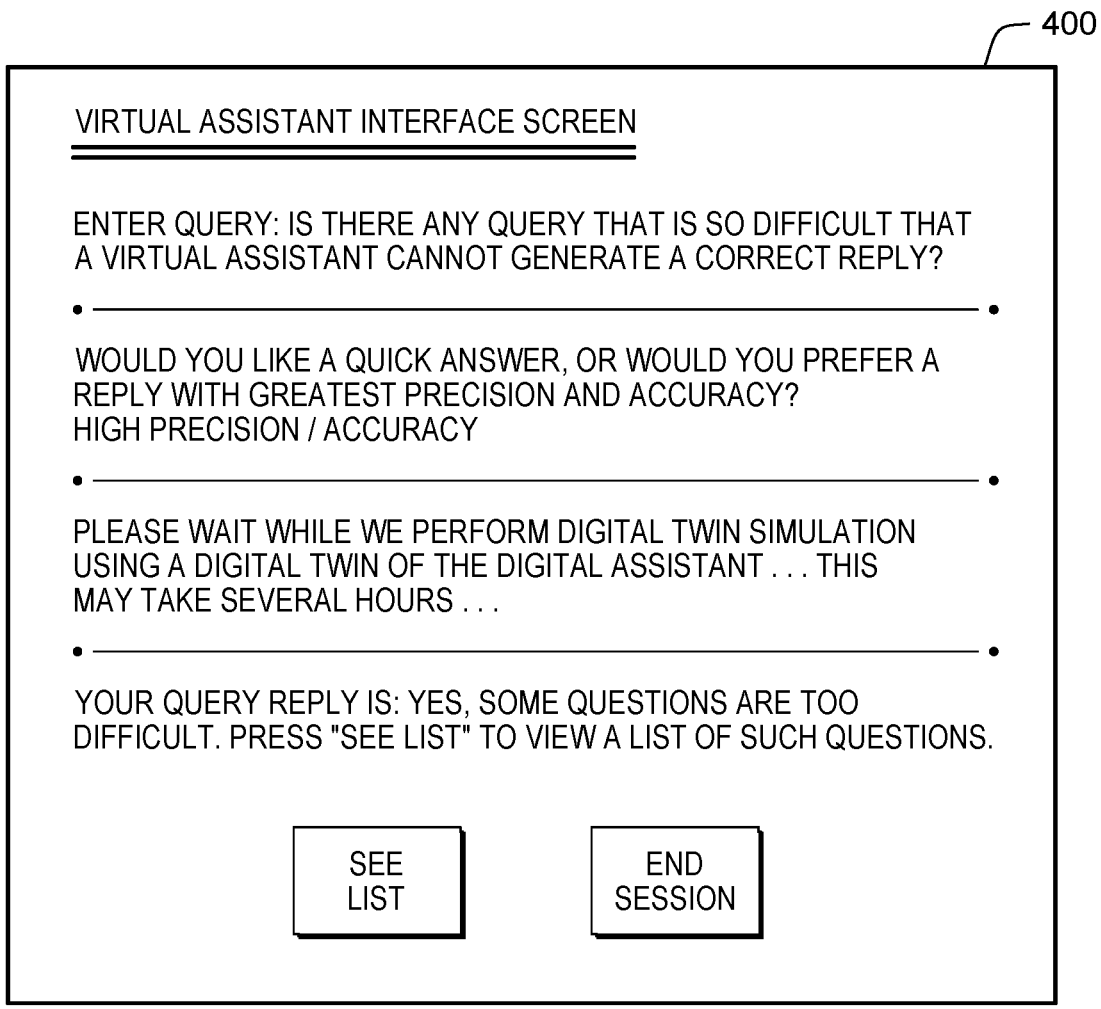
FIG. 4 is a screenshot view generated by the first embodiment system.

Processing begins at operation S255, where input module ("mod") 302 receives a first query from a first user over communication network 114 receives a first query from a first user over communication network 114. More specifically, in this example, the first user enters the query through client sub-system 104 (that is, in this example, the user's smart phone). The query of this example is shown in screen shot 400 of FIG. 4.

Processing proceeds to operation S260, where digital twin simulation 308 is performed by processing mod 304 to obtain the most accurate and precise answer to the query that is feasible. In this example, and as shown in screen shot 400, the user is given the choice as to whether to perform the digital twin simulation or not because digital twin simulations typically take much, much more time than traditional query responses obtained from pre-existing knowledge corpuses (for example, knowledge base data store 306). As discussed in the following sub-section, and as mentioned above, in some embodiments, a digital twin simulation is performed only if the required precision and/or accuracy associated with the query would require a simulation, instead of mere consultation of a passive knowledge corpus. In these embodiments, there may be, for example, one precision/accuracy threshold value (that is p/a threshold value) associated with precision and another p/a value associated with accuracy.

Processing proceeds to operation S265, where processing mod 304 generates a query response based on the digital twin simulation of operation S265. The query response under the present example is shown in screen shot 400.

Processing proceeds to operation S270, where output mod 310 communicates the first query response to the first user at client subsystem 104. The response in this example is shown in screenshot 400.

III. Further Comments and/or Embodiments

Some embodiments of the present invention recognize the following facts, potential problems and/or potential areas for improvement with respect to the current state of the art: (i) virtual assistance systems such as an AI (artificial intelligence) voice assistance system, or chatbot, use a knowledge corpus to reply to the user; (ii) users can ask voice or textual based questions to the virtual assistance system and the virtual assistance system will reply to the user; (iii) the virtual assistance system uses the knowledge corpus to inform the content for its response to the user; and/or (iv) in various scenarios, if a user's question is related to a future state of any activity, such as how long their vehicle will travel with its remaining fuel, then the reply from the knowledge corpus may not be very accurate, because various dynamic parameters are involved, such as weather conditions, traffic conditions, road conditions, and so on.

Some embodiments of the present invention may include one, or more, of the following operations, features, characteristics and/or advantages: (i) based on any submitted query, and the context of the query, the AI enabled virtual assistance system will predict the degree of precision required in the reply; (ii) the AI enabled virtual assistance system will identify if the reply can be provided to the user from an existing knowledge corpus or needs a digital twin simulation to identify the response to the query; (iii) the AI system will analyze the context of the query to identify the priority and required degree of precision of the response; (iv) based on submitted query, the AI system will initially reply from the knowledge corpus and later the precise reply will be provided after completing a digital twin simulation; (v) the virtual assistance system will compare the response from the knowledge corpus and the digital twin simulation-based response and identify which query is to be answered with the digital twin simulation; (vi) if the required precision level is high, the system will decide which query will be replied to from the knowledge corpus; (vii) the virtual assistance system knows when to perform a digital twin simulation before responding and when to reply from a knowledge corpus; and/or (viii) the virtual assistance system reply will take a comparatively longer time to respond if based on a digital twin simulation based result.

Some embodiments of the present invention may include one, or more, of the following operations, features, characteristics and/or advantages: (i) predicts a contextual situation, and accordingly, predicts a response to the user's query in advance along with the associated degree of precision in the voice reply; (ii) proactively performs a digital twin simulation of the predicted queries so that the user can be provided with a higher precision response within the shortest possible time; (iii) based on the submitted query, if the system identifies a digital twin simulation is to be considered to reply to the query, the system will analyze the context of the query to identify what parameters are to be considered for the digital twin simulation; (iv) considers whether the same or similar query has been submitted by a different or the same user in the same surrounding context; (v) identifies whether a digital twin simulation has already been performed and the validity of the digital twin simulation results; (vi) determines whether a previous digital twin simulation result can be used or another digital twin simulation needs to be performed; and/or (vii) performs a digital twin simulation of the voice command while executing the command in a physical machine and will compute a precise answer; and/or (viii) for example, fuel consumption depends on various real-time information so the system will perform a digital twin simulation, and identify the answer to the question.

Some embodiments of the present invention may include one, or more, of the following operations, features, characteristics and/or advantages: (i) based on a submitted query, parses the query to understand the current contextual aspect to retrieve the immediate response from the available knowledge corpus; (ii) derives aspects of the query which are futuristic; (iii) derives aspects of the query which will need forecasting; (iv) based on an identified forecast, builds a response by deriving all the parameters that need to be validated; (v) inputs the parameters to the digital twin platform to get the precise forecasted response; (vi) while delivering a forecasted response, monitors activity around the query/response; (vii) when activity is complete, the system self-validates the forecasted response, (viii) improvises the knowledge corpus or parameters used to derive a futuristic response; (ix) the voice assistant, based on a confidence level, will use a knowledge corpus to improve on the answer to be presented to the user in a positive manner; and/or (x) helps the end user have more confidence in the accuracy and/or precision inherent in the replies received from the voice assistant.

Figure 5:
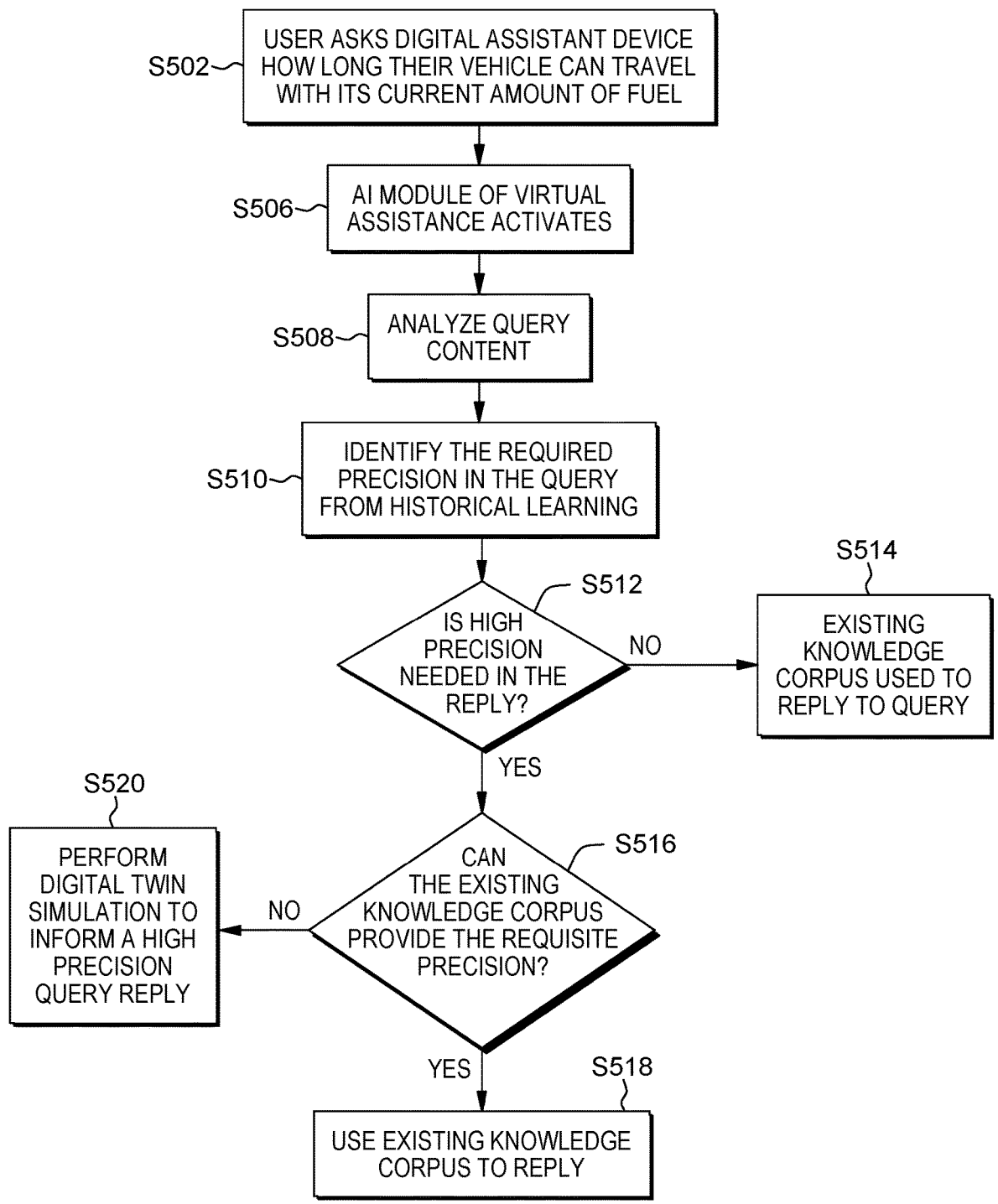
FIG. 5 is a flowchart showing a second embodiment method.

As shown in FIG. 5, flowchart 500 represents a method according to an embodiment of the present invention where a user asks a question to an AI voice assistance system to generate a query. Based on historical learning, the system has identified that the user requires a high level of precision and/or accuracy in the reply and the existing knowledge corpus will not be able to provide this required level of precision. Thus, the system will initiate a digital twin simulation to provide the reply. The method includes the following operations (with process flow among and between the operations as shown by arrows in FIG. 5): receive query S502; activate S506; analyze S508; accuracy/precision determination S510; first decision operation S512; low precision query response using knowledge base S514; second decision block S516; query response using high precision knowledge base S518; and digital twin based query response S520.

A method for answering user queries with selective recourse to a knowledge corpus and/or digital twin simulation includes the following operations (not necessarily in the following order): (i) the virtual assistance system will have a knowledge corpus; (ii) the knowledge corpus will be created based on historical learning of different types of interaction; (iii) the AI enabled system will classify the query based on the context of the query, such as if the answer needs multiple sources of data; (iv) the multiple sources of data can be various IoT (internet of things) feeds, weather information, etc., and will classify the queries as candidates for a digital twin simulation; (v) the knowledge corpus will be created based on historical usage data and digital twin simulation; (vi) if the system considers digital twin simulation for creating a knowledge corpus, then the system will consider when the digital twin simulation will be performed and what parameter(s) are considered; (vii) if the knowledge corpus is created based on old digital twin simulation means, it will be part of the knowledge corpus; (viii) the system will compare the reply from the knowledge corpus and the reply created from digital twin simulation and will identify the deviation with the reply; (ix) based on the identified deviation in the reply between the knowledge corpus and the digital twin simulation, the system will identify which reply can be provided from the knowledge corpus and which reply needs a digital twin simulation; (x) the system will identify the types of queries where a digital twin simulation is required to identify the answers; and (xi) the system will historically consider the level of precision that is required in the answers from the virtual assistance.

A method according to an embodiment of the present invention includes the following operations (not necessarily in the following order): (i) during the learning process, the user can define which replies are precision replies; (ii) the system will analyze the queries submitted by the users; (iii) when a user submits a query, the virtual assistance system will identify the context of the submitted query; (iv) based on the identified context of the query, the system will identify a level of precision required in the reply (the level of precision required in the reply will be identified based on historical interaction of the user with virtual assistance); and (v) the virtual assistance system will identify the query and will use the knowledge corpus to identify if the reply can be provided from the knowledge corpus or if a digital twin simulation is needed to achieve the requisite level of precision in the query response.

A method according to an embodiment of the present invention includes the following operations (not necessarily in the following order): (i) the system will reply to the voice command directly from the knowledge corpus if the knowledge corpus can provide the required precision and the reply is not changed based on the change in context; (ii) if the system identifies the knowledge corpus is not able to provide the required precision, then the system will initiate a digital twin simulation; (iii) the system will identify the required parameters and will perform the digital twin simulation to reply to the user; (iv) based on historical learning, the system will predict what types of queries the user will ask for in any contextual situation; (v) based on prediction of the query, the system will perform a digital twin simulation to prepare the reply for the user in a proactive manner; and (vi) response will be based on a confidence level where the recommendation/answer will be provided in positive manner, and the user will not feel irritated.

IV. Definitions

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

And/or: inclusive or; for example, A, B "and/or" C means that at least one of A or B or C is true and applicable.

Including/include/includes: unless otherwise explicitly noted, means "including but not necessarily limited to."

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

Set of thing(s): does not include the null set; "set of thing(s)" means that there exist at least one of the thing, and possibly more; for example, a set of computer(s) means at least one computer and possibly more.

Virtualized computing environments (VCEs): VCEs can be stored as "images." A new active instance of the VCE can be instantiated from the image. Two types of VCEs are virtual machines and containers. A container is a VCE that uses operating-system-level virtualization. This refers to an operating system feature in which the kernel allows the existence of multiple isolated user-space instances, called containers. This isolated user-space instances may look like real computers from the point of view of programs running in them. A computer program running on an ordinary operating system can see all resources (connected devices, files and folders, network shares, CPU power, quantifiable hardware capabilities) of that computer. However, programs running inside a container can only see the container's contents and devices assigned to the container.

Cloud computing system: a computer system that is distributed over the geographical range of a communication network(s), where the computing work and/or computing resources on the server side are primarily (or entirely) implemented by VCEs (see definition of VCEs in previous paragraph). Cloud computing systems typically include a cloud orchestration module, layer and/or program that manages and controls the VCEs on the server side with respect to instantiations, configurations, movements between physical host devices, terminations of previously active VCEs and the like.

What is claimed is:

1. A computer implemented method (CIM) for use with a digital twin data set that represents a real life product, the CIM comprising:
   predicting, by an AI enabled voice assistance system and based in part on a historical learning data set, a first type of query that will be asked by a requesting user in a first contextual situation, the historical learning data set indicating a level of precision required by the requesting user for a response to the first type of query;
   based on the first type of query, automatically performing, by the AI enabled voice assistance system, a digital twin simulation to prepare accurate responses to a set of predicted queries for the user in a proactive manner;
   receiving, from a user and over a communication network, in the first contextual situation, a first query that relates to the real life product, the first query being the predicted first type of query, which requires a high level of precision;
   identifying an accurate response to the first query by matching the first query to a predicted query of the set of predicted queries, the digital twin simulation having already been performed for the predicted query; and
   communicating, over the communication network and to the first user, the accurate response to the first query.

2. The CIM of claim 1, wherein the real life product is a vehicle.

3. The CIM of claim 1, further comprising:
   receiving, by the AI enabled voice assistance system, a historical learning data set.

4. The CIM of claim 1 further comprising:
   consulting a pre-existing knowledge corpus to obtain an alternative response to the first query;
   comparing the response and the alternative response to determine to identify a deviation between the response and the alternative response; and
   based on the identified deviation, communicating to the first user over the communication network, the alternative response.

5. A computer implemented method (CIM) for use with a digital twin data set that represents a real life process, the CIM comprising:
   predicting, based in part on a historical learning data set, a first type of query that will be asked by a requesting user in a first contextual situation, the historical learning data set indicating a level of precision required by the requesting user;
   based on the first type of query, performing, by an AI enabled voice assistance system, a digital twin simulation to prepare accurate responses to a set of predicted queries for the user in a proactive manner;
   receiving, from a first user and over a communication network, in the first contextual situation, a first query that relates to the real life process, the first query being the predicted first type of query, which requires a high level of precision;
   identifying an accurate response to a predicted query of the set of predicted queries, the predicted query matching the first query to a predicted query of the set of predicted queries, the digital twin simulation having already been performed for the predicted query; and
   communicating, over the communication network and to the first user, the accurate response to the predicted query, responsive to the first query.

6. The CIM of claim 5, wherein the real life process is an industrial manufacturing process.

7. The CIM of claim 5, further comprising:
   Receiving, by the AI enabled voice assistance system, the historical learning data set.

8. The CIM of claim 5 further comprising:
   consulting a pre-existing knowledge corpus to obtain an alternative response to the first query;
   comparing the response and the alternative response to determine to identify a deviation between the response and the alternative response; and
   based on the identified deviation, communicating to the first user over the communication network, the alternative response.

9. A computer-implemented method (CIM) for use with a digital twin data set that represents a real-world product, the CIM comprising:
   receiving, from a first user and over a communication network a first query that relates to a real-world product;
   determining a first precision threshold value representing a degree of precision appropriate for a response to the first query;
   determining that an immediate response to the first query received from a pre-existing knowledge corpus will not meet the first precision threshold value; and
   responsive to the determination that the immediate response will not meet the first precision threshold value:
      performing a digital twin simulation on a digital twin data set representing the real-world product to obtain a precise response to the first query, which satisfies the first precision threshold value, and
   communicating, over the communication network and to the first user, the precise response to the first query.

10. The CIM of claim 9 further comprising:
    receiving, from the first user and over the communication network a second query that relates to the real-world product;
    determining a second accuracy threshold value representing a degree of accuracy is appropriate for responding to the second query;
    determining that a standard response to the second query received from a pre-existing knowledge corpus will meet the second accuracy threshold value;
    responsive to the determination that the response will meet the second accuracy threshold value:

querying the knowledge corpus to obtain an initial response to the second query, and communicating, over the communication network and to the first user, the initial response to the second query.

11. The CIM of claim 9 wherein the performance of the digital twin simulation is performed by an artificial intelligence (AI) enabled virtual assistance system.

12. The CIM of claim 11 further comprising:

receiving, by the AI enabled voice assistance system, a historical learning data set;

predicting, by the AI enabled voice assistance system, a first type of query that the first user will ask for in a first contextual situation.

13. The CIM of claim 12 further comprising:

based on the prediction of the first type of query, performing, by the AI enabled voice assistance system, the digital twin simulation to prepare the precise response for the first user in a proactive manner.

* * * * *